(12) United States Patent
Walker

(10) Patent No.: US 9,275,692 B2
(45) Date of Patent: Mar. 1, 2016

(54) MEMORY, MEMORY CONTROLLERS, AND METHODS FOR DYNAMICALLY SWITCHING A DATA MASKING/DATA BUS INVERSION INPUT

(75) Inventor: Robert M. Walker, Raleigh, NC (US)

(73) Assignee: Micron Technology, Inc., Boise, ID (US)

( * ) Notice: Subject to any disclaimer, the term of this patent is extended or adjusted under 35 U.S.C. 154(b) by 582 days.

(21) Appl. No.: 13/407,328

(22) Filed: Feb. 28, 2012

(65) Prior Publication Data

US 2013/0227210 A1    Aug. 29, 2013

(51) Int. Cl.
| | |
|---|---|
| *G06F 12/00* | (2006.01) |
| *G11C 7/02* | (2006.01) |
| *G11C 7/10* | (2006.01) |
| *G11C 11/4096* | (2006.01) |
| *G06F 1/32* | (2006.01) |

(52) U.S. Cl.
CPC ............... *G11C 7/02* (2013.01); *G11C 7/1006* (2013.01); *G11C 7/1009* (2013.01); *G11C 11/4096* (2013.01); *G06F 1/3253* (2013.01); *Y02B 60/1235* (2013.01)

(58) Field of Classification Search
CPC ............ G06F 13/4217; G06F 13/4243; G06F 13/4213; G06F 13/00; G06F 13/14; G06F 13/38; G06F 13/4234; G06F 13/4239; G06F 13/16; G06F 9/30018; G06F 9/3004; G06F 7/501; G06F 7/764; G06F 11/20; G06F 11/25; G06F 12/00

USPC ........... 711/154, E12.001, 105, 167, E12.002
See application file for complete search history.

(56) References Cited

U.S. PATENT DOCUMENTS

| | | | | |
|---|---|---|---|---|
| 5,319,763 | A * | 6/1994 | Ho ..................... | G06F 9/30018 711/108 |
| 7,139,852 | B2 | 11/2006 | LaBerge | |
| 8,031,538 | B2 | 10/2011 | Macri et al. | |
| 8,347,020 | B2 * | 1/2013 | Maddali ............. | G06F 12/0215 711/105 |
| 2004/0010569 | A1 * | 1/2004 | Thomas et al. ............... | 709/220 |
| 2005/0182894 | A1 * | 8/2005 | LaBerge ............. | G06F 13/4243 711/105 |
| 2009/0089557 | A1 | 4/2009 | Luo et al. | |
| 2010/0005217 | A1 * | 1/2010 | Jeddeloh ............ | G11C 11/4093 711/1 |
| 2011/0030064 | A1 * | 2/2011 | Kwak .................. | G11C 7/1078 726/26 |
| 2011/0084737 | A1 * | 4/2011 | Oh et al. ........................ | 327/108 |
| 2011/0153939 | A1 * | 6/2011 | Choi .............................. | 711/118 |
| 2011/0252171 | A1 | 10/2011 | Dearth et al. | |

FOREIGN PATENT DOCUMENTS

WO    2011/008394 A2    1/2011

\* cited by examiner

*Primary Examiner* — Tuan Thai
*Assistant Examiner* — Edward Waddy, Jr.
(74) *Attorney, Agent, or Firm* — Dorsey & Whitney LLP

(57) ABSTRACT

Examples are described herein of dynamic switching of data masking and data bus inversion functionality of a memory input. Both dynamic switching and a static setting for the memory input may be supported in some examples described herein. Use of a command indicating a functionality of the memory input is described.

26 Claims, 5 Drawing Sheets

Persistent  505
    NOP (masking)
    Masked Write 1
    Masked Write 2

Not Persistent  510
    NOP (masking)
    Masked Write 1
    NOP (masking)
    Masked Write 2

Figure 5

MEMORY, MEMORY CONTROLLERS, AND METHODS FOR DYNAMICALLY SWITCHING A DATA MASKING/DATA BUS INVERSION INPUT

TECHNICAL FIELD

Embodiments described herein relate generally to semiconductor memory, and examples of dynamically controlling use of a data mask/data bus inversion input are described.

BACKGROUND

Memory may be provided in or for use by computers or other electronic devices including, but not limited to, portable memory devices, solid state drives, personal digital assistants, tablets, music players, cameras, phones, wireless devices, displays, chip sets, set top boxes, gaming systems, vehicles, and appliances. There are many different types of memory including random-access memory (RAM), read only memory (ROM), dynamic random access memory (DRAM), synchronous dynamic random access memory (SDRAM), flash memory, and resistance variable memory, among others.

During memory operation, data may be transferred to and from a memory device in accordance with commands and addresses sent by a memory controller. A variety of techniques may be employed to improve the performance of memory devices. Two of those techniques are data masking and data bus inversion.

Data masking (DM) may be used advantageously during data writes to memories where data is accessed in groups. So, for example, a DRAM write may typically access a predetermined amount of memory in one write command (e.g. 8 bytes). This predetermined amount of memory may be related to an amount of memory prefetched by a particular memory device. However, in some examples, a write command may actually affect a lesser amount of memory (e.g. 6 bytes). Without data masking, all 8 bytes may need to be read, 6 of those bytes modified, and then all 8 written back again. With data masking, the memory device itself may not write the unchanged entries. Data masking may be implemented, for example, by suppressing a column select signal for columns that are not changed by a particular write command.

To implement data masking, a data mask input may be provided on memory devices. The data mask input may receive a signal that indicates to the memory device that data should be masked. In this manner, the masking may be selectively applied to data as needed. Data masking may be particularly advantageous in systems that access smaller amounts of data at a time, such as, but not limited to, systems utilizing ARM processors.

Data bus inversion (DBI) may be used to advantageously reduce power consumption and/or decrease simultaneous switching noise in memory devices. In data bus inversion, the data carried by a particular bus may be inverted—for example, data that would typically be represented as a logical 'high' may be represented as a logical 'low', and vice versa. A data bus inversion signal may be provided to a memory device to indicate when data carried by a bus has been inverted, so that the memory device may invert the data prior to storage, for example.

BRIEF DESCRIPTION OF THE DRAWINGS

FIG. 5 is a chart illustrating a sequence of memory commands that may occur in both a persistent and a not persistent example.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, computer system components, and software operations have not been shown in detail in order to avoid unnecessarily obscuring the described embodiments of the invention.

Embodiments of the present invention may advantageously allow for data masking and data bus inversion signals to be received at a same input of a memory device, and the function of that input switched dynamically during operation of the memory device.

Memory devices may utilize a single input (e.g. pin) to implement data masking and data bus inversion functionality. For example, a mode register may be provided in a memory device that may be programmed (e.g. by a memory controller) to indicate whether the single input is used for data masking or data bus inversion functionality, as has been proposed in the JEDEC DDR4 specification. If the mode register indicates data masking, the signals received at the single input may be used to implement data masking. However, if the mode register indicates data bus inversion, the signals received at the single input may be used to implement data bus inversion. Utilizing a mode register in this manner may allow a single device to employ either data mask functionality or data bus inversion functionality, but that designation would be fixed throughout operation of the device. Examples described further below may support dynamic switching of a DM/DBI input from data masking to data bus inversion functionality during operation.

Figure 1:
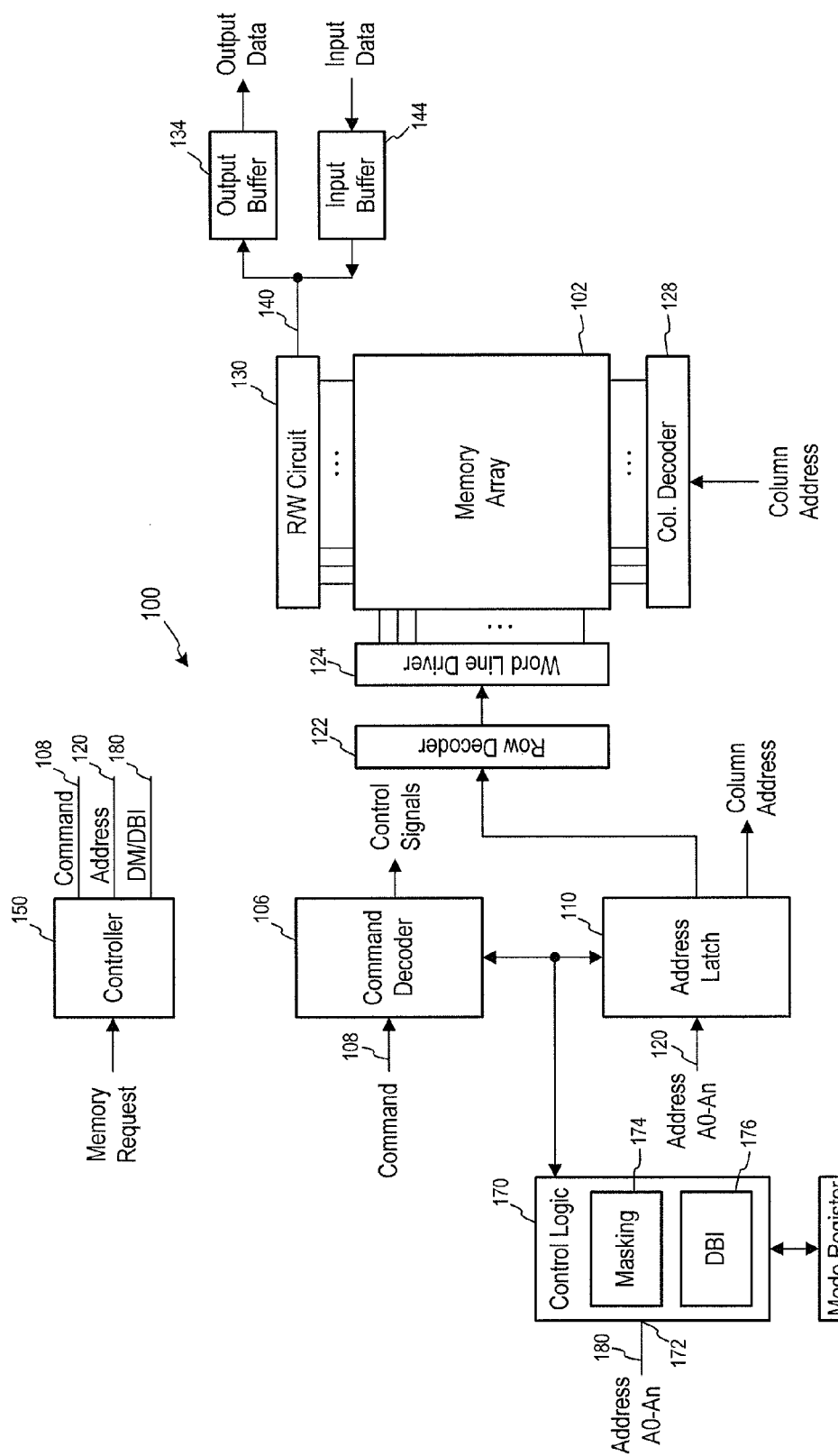
FIG. 1 is a schematic illustration of a portion of a memory 100 according to an embodiment of the present invention.

FIG. 1 is a schematic illustration of a portion of a memory 100 according to an embodiment of the present invention. The memory 100 includes a plurality of memory cells which may be arranged as an array 102 of memory cells, which may be, for example, DRAM memory cells, or other types of memory cells. The memory 100 also includes a command decoder 106 that may receive memory commands through a command bus 108 and generate corresponding control signals within the memory system 100 to carry out various memory operations. A controller 150, which may be located on a different semiconductor chip than the memory array 102, may provide the command signals at an output (e.g. on the command bus 108) responsive to received memory requests from a computing system served by the memory 100. The memory requests may be received by an input of the controller. The controller 150 may include logic and/or a processor sufficient to provide the signals described herein. The command decoder 106 may respond to memory commands provided to the command bus 108 to perform various operations on the memory array 102. For example, the command decoder 106 may be used to provide internal control signals to read data from and write data to the memory array 102.

Row and column address signals may be provided to the memory 100 through an address bus 120 and provided to an address latch 110. The address, e.g. row and column address signals may also be provided by the controller 150 at an output of the controller (e.g. the address bus 120). The address latch 110 may output a separate column address and a separate row address. In some embodiments, the command and address buses 108 and 120 may be combined.

The row and column addresses may be provided from the address latch 110 to a row address decoder 122 and a column address decoder 128, respectively. The column address decoder 128 may select bit lines extending through the array 102 corresponding to respective column addresses. The row address decoder 122 may be connected to word line driver 124 that may activate respective rows of memory cells in the array 102 corresponding to received row addresses. The selected data line (e.g., a bit line or bit lines) corresponding to a received column address may be coupled to read/write circuitry 130 to provide read data to a data output buffer 134 via an input-output data bus 140. Write data may be provided to the memory array 102 through a data input buffer 144 and the memory array read/write circuitry 130. In some embodiments, the data bus 140 may be combined with the command and/or address buses 108 and/or 120.

The memory 100 may also include control logic 170, which may be in communication with a DM/DBI input 172. The DM/DBI input 172 may, for example, be implemented as a pin of a memory device package. The control logic 170 may include masking control logic 174 and DBI control logic 176. The masking control logic 174 may provide signals to the command decoder 106, row decoder 122, and/or column decoder 128 to allow the memory 100 to implement masked writes in accordance with a signal received at the DM/DBI input 172. For example, when the control logic 170 has coupled the masking control logic between the DM/DBI input 172 and other components of the memory system, the masking control logic 174 may respond to a particular logic level received at the DM/DBI input 172 to mask an associated write request. For example, a logic HIGH received at the DM/DBI input 172 may indicate to the masking control logic 174 to implement a masked write, or a logic LOW in other examples.

The DBI control logic 176 may provide signals to the command decoder 106, row decoder 122, column decoder 128, and/or read/write circuit 130 to allow the memory 100 to implement data bus inversion. For example, when the control logic 170 has coupled the DBI control logic 176 between the DM/DBI input 172 and other memory components, the DBI control logic 176 may operate responsive to a signal received at the DM/DBI input 172 to implement data bus inversion. For example, a logic HIGH received at the DM/DBI input 172 may indicate to the data bus inversion control logic to implement data bus inversion, or a logic LOW in other examples.

The control logic 170 may be coupled to the DM/DBI input 172 and may select which of the masking control logic 174 or DBI control logic 176 is active at any particular time during memory operation, such as by coupling the selected masking control or DBI control logic to the DM/DBI input 172 at particular times and/or disconnecting the masking control logic 174 or DBI control logic 176 from other memory components at particular times. The memory 100 may also include a mode register 160. The mode register 160 may be programmed with a value indicative of whether dynamic switching of the DM/DBI 172 functionality is in use, and/or may be programmed with a value indicative of which of the masking control or DBI control logic is to be used responsive to signals at the DM/DBI input 172. The controller 150 may provide a DM/DBI signal at an output of the controller (e.g. on the DM/DBI bus 180, which may be combined with the command or address buses 108, 120 in some examples). The signal provided by the controller 150 on the DM/DBI bus 180 may be provided to the DM/DBI input 172 of the memory 100.

The memory shown in FIG. 1 may be implemented in any of a variety of products employing processors and memory including for example computers, cameras, phones, wireless devices, displays, chip sets, set top boxes, tablets, gaming systems, vehicles, and appliances. Resulting devices employing the memory may benefit from the embodiments of the memory and examples of DM/DBI dynamic switching described herein to perform their ultimate user function.

Having described components of a memory according to embodiments of the present invention, examples of utilizing the components to dynamically switch use of a DM/DBI input during operation will now be described. Generally, the controller 150 may provide a command (e.g., a command including a spare bit), such as a no-operation (NOP) command, that may include an indication of whether the signal provided on the bus 180 should be interpreted as a data mask signal or a data bus inversion signal. Accordingly, either the masking control logic 174 or the DBI control logic 176 may be used to provide internal memory signals responsive to the DM/DBI signal provided at the input 172.

Figure 2:
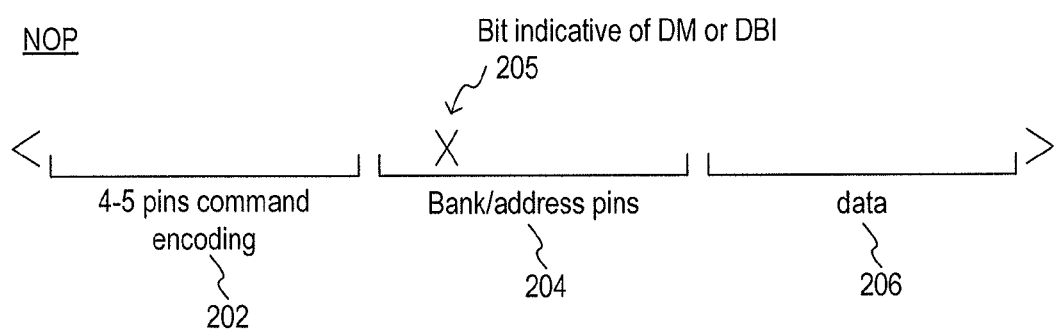
FIG. 2 is a schematic illustration of an example NOP command in accordance with an embodiment of the present invention.

FIG. 2 is a schematic illustration of an example NOP command in accordance with an embodiment of the present invention. The NOP command 200 includes a first number of bits 202, which may correspond with pins on a memory that receive the bits. The first number of bits 202 encode the command 200 as a NOP command. Accordingly, when the NOP command 200 is provided to the command decoder 106 of FIG. 1, it may be decoded as a NOP command, and may not result in a memory access. A next number of bits 204 of the NOP command 200 typically correspond with a portion of a command encoding an address. The address bits in a NOP command are typically not used by the memory, because no memory access may be associated with the NOP command. In embodiments of the present invention, however, at least one bit of the address bits 204 may be used to indicate DM or DBI functionality. The bit 205 is shown for this purpose in FIG. 2, although any bank or address bit may be used. Accordingly, a '1' in this position may be indicative of DM functionality, while a '0' may be indicative of DBI functionality, or vice versa. A remaining number of bits 206 of the NOP command 200 may correspond with data bits and these may not be altered in embodiments of the present invention, as they may carry data related to other commands in pipelined systems, for example. The NOP command 200 of FIG. 2 accordingly includes a bit carried in the address section of the NOP command that may be utilized by a memory to determine how to interpret signals received at a combined DM/DBI input, such as the input 172 of FIG. 1. The NOP command of FIG. 2 may be provided by a controller, such as the controller 150 of FIG. 1, and may be provided to a command decoder, such as the command decoder 108 of FIG. 1.

On receipt of the NOP command 200, the command decoder 106 of FIG. 1 may decode the command as a NOP command and, responsive to the bit 205, cause either the masking control logic 174 or the DBI control logic 176 to be coupled between the input 172 and other internal memory components such that a DM/DBI signal received at the input 172 may be interpreted correctly as either a data mask or data bus inversion signal. Once set to interpret the input 172 as either data mask or data bus inversion, the control logic may either maintain the selected functionality until receipt of another NOP command, or the control logic in other embodiments may return the use of the DM/DBI input 172 to a default functionality. Examples of both types of embodiments will now be described.

Figure 3:
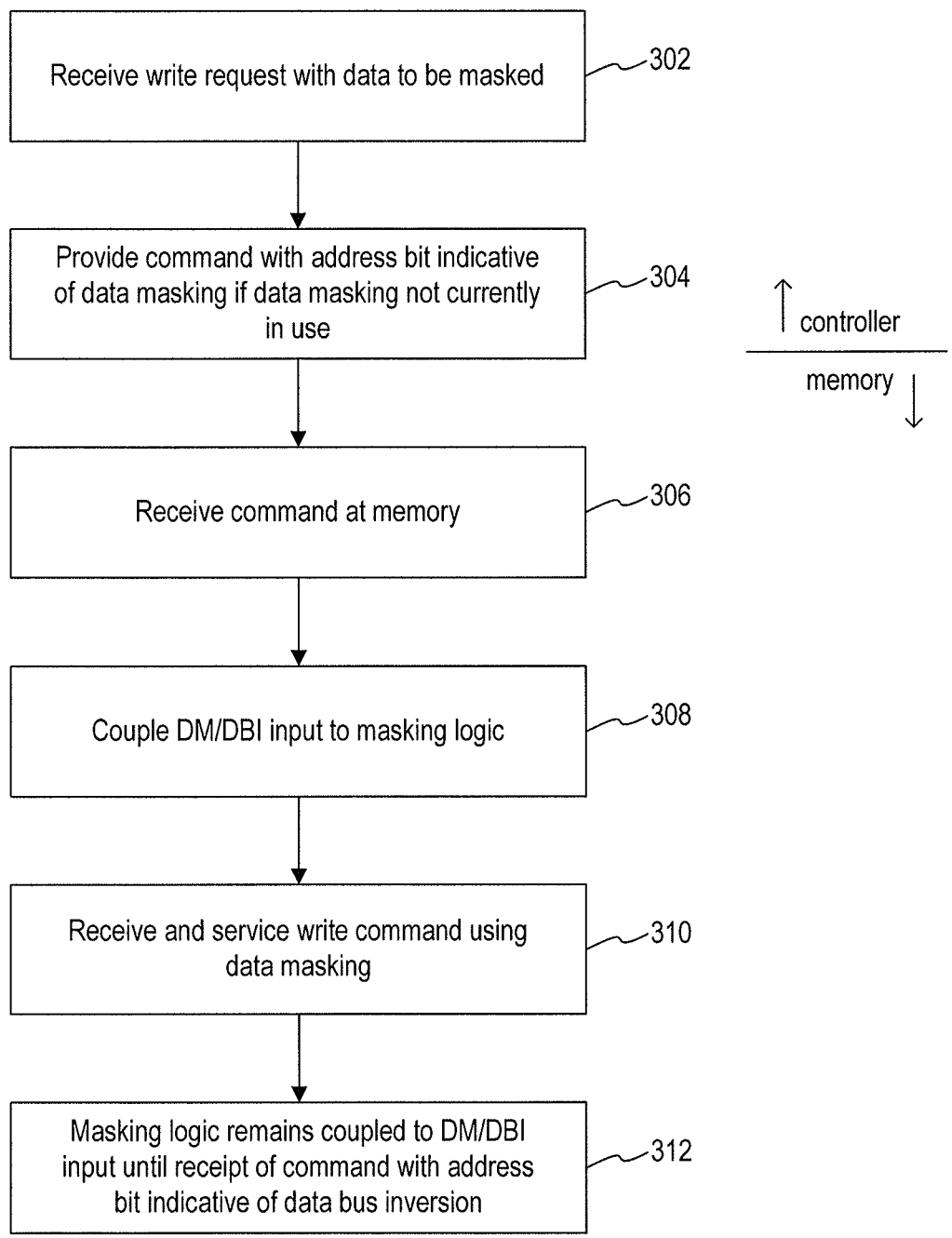
FIG. 3 is a flow chart illustrating an example method of utilizing a DM/DBI input according to an embodiment of the present invention using a persistent DM/DBI setting.

FIG. 3 is a flow chart illustrating an example method of utilizing a DM/DBI input according to an embodiment of the present invention using a persistent DM/DBI setting. The method 300 includes portions that may be implemented by a controller, such as the controller 150 of FIG. 1, and portions that may be implemented by a memory, such as the memory 100 of FIG. 1, although in other embodiments the allocation of method steps may be different between physical components.

In block 302, a memory controller may receive a write request with data to be masked. The request may come from generally any application or processor-based system utilizing a memory. The memory controller in block 304 may provide a NOP command with an address bit indicative of data masking. An example of such a NOP command has been described above with regard to FIG. 2 and NOP 200. The NOP command may be provided if data masking is not currently in use. That is, the controller may only provide the NOP if the DM/DBI input of a memory is being used for DBI or other control. As will be described further below, during embodiments using a persistent DM/DBI setting, it may not be necessary to send a NOP for each write request. In block 306, a memory may receive the NOP command. For example, referring to FIG. 1, the NOP command may be received by the command decoder 106. The command decoder 106 may decode the NOP command and recognize the address bit indicative of data masking. Responsive to the NOP command, the command decoder 106 may provide appropriate signals to utilize the DM/DBI input 172 to implement data masking.

Referring back to FIG. 3, the memory in block 308 may couple the DM/DBI input to masking control logic responsive to receipt of a NOP command including an address bit indicative of data masking. In other examples, the masking control logic may be already coupled to the DM/DBI input, and the control logic may couple the masking control logic to other portions of the memory such that signals generated by the masking control logic become effective to perform data masking responsive to receipt of the NOP command including an address bit indicative of data masking. In any event, data masking functionality may be enabled in the memory by the memory controller providing the NOP command including the appropriate address bit.

In block 310, a write command may be received by the memory, such as by the command decoder 106 of FIG. 1, and the write command may be serviced using data masking. As mentioned above, in the embodiment of FIG. 3, the NOP command provided by the controller may have a persistent effect. Accordingly, the input 172 may continue to be used to implement data masking until the memory receives a subsequent NOP command with an address bit indicative of data bus inversion. Referring back to FIG. 3, in block 312 the masking control logic may remain coupled to the DM/DBI input until receipt of another NOP command with an address bit indicative of data bus inversion. In some embodiments, the connection between the DM/DBI input and the masking control logic may remain, but the connections between the masking control logic, DBI control logic, and remaining portions of the memory may change responsive to the NOP commands to facilitate a change in functionality.

FIG. 3 illustrates an example of a memory responding to a NOP command indicative of data masking. At other times or in other examples, in block 304 a NOP command may be provided with an address bit indicative of data bus inversion responsive to a memory request requiring data bus inversion. In block 308 then the DM/DBI input may be coupled to the DBI control logic for implementing data bus inversion. The memory may continue to implement data bus inversion until such a time as a NOP command is received indicative of data masking.

Figure 4:
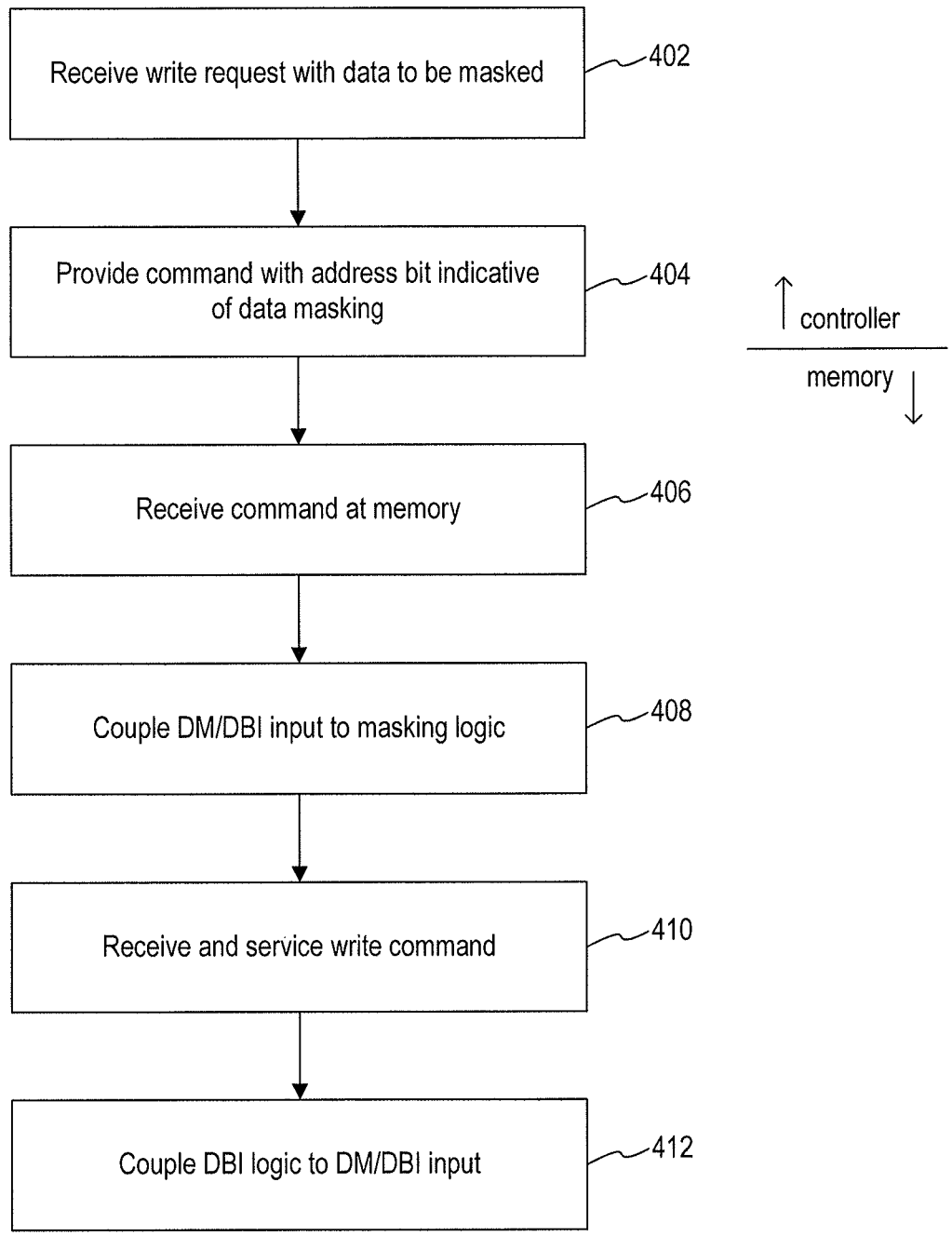
FIG. 4 is a flow chart illustrating an example method of utilizing a DM/DBI input according to an embodiment of the present invention using a non-persistent DM/DBI setting.

FIG. 4 is a flow chart illustrating an example method of utilizing a DM/DBI input according to an embodiment of the present invention using a non-persistent DM/DBI setting. The method 400 includes portions that may be implemented by a controller, such as the controller 150 of FIG. 1, and portions that may be implemented by a memory, such as the memory 100 of FIG. 1, although in other embodiments the allocation of method steps may be different between physical components.

In block 402, a memory controller may receive a write request with data to be masked. The request may come from generally any application or processor-based system utilizing a memory. The memory controller in block 404 may provide a NOP command with an address bit indicative of data masking. An example of such a NOP command has been described above with regard to FIG. 2 and NOP 200. In the example of FIG. 4, a NOP command with an address bit indicative of data masking may be provided each time a write request with data to be masked is received. As will be described further below, following servicing of a masked write, the functionality of the DM/DBI input may be changed to data bus inversion functionality.

In block 406, a memory may receive the NOP command. For example, referring to FIG. 1, the NOP command may be received by the command decoder 106. The command decoder 106 may decode the NOP command and recognize the address bit indicative of data masking. Responsive to the NOP command, the command decoder 106 may provide appropriate signals to utilize the DM/DBI input 172 to implement data masking.

Referring back to FIG. 4, the memory in block 408 may couple the DM/DBI input to masking control logic responsive to receipt of a NOP command including an address bit indicative of data masking. In other examples, the masking control logic may be already coupled to the DM/DBI input, and the control logic may couple the masking control logic to other portions of the memory such that signals generated by the masking control logic become effective to perform data masking responsive to receipt of the NOP command including an address bit indicative of data masking. In any event, data masking functionality may be enabled in the memory by the memory controller providing the NOP command including the appropriate address bit.

In block 410, a write command may be received by the memory, such as by the command decoder 106 of FIG. 1, and the write command may be serviced using data masking. As mentioned above, in the embodiment of FIG. 4, the NOP command provided by the controller may not have a persistent effect. Accordingly, in block 412, the DM/DBI input may be reset to use in data bus inversion functionality. Data bus inversion functionality for the DM/DBI input may be implemented by coupling the DBI control logic to the DM/DBI input in block 412. In other examples, both the DM and DBI control logic may be coupled to the DM/DBI input and connections between other memory components (e.g. row decoder, column decoder, r/w circuit) may be adjusted responsive to the desired functionality.

FIG. 4 illustrates an example of a memory responding to a NOP command indicative of data masking where the default setting for the functionality of the input is DBI functionality. At other times or in other examples, in block 404 a NOP command may be provided with an address bit indicative of data bus inversion responsive to a memory request requiring data bus inversion, and a default setting may be data masking. In block 408 then the DM/DBI input may be coupled to the DBI control logic for implementing data bus inversion. The memory may reset the functionality to data masking following servicing of the memory request requiring data bus inversion.

Examples have accordingly been described above for dynamic switching of a DM/DBI input between data masking and data bus inversion functionality. The switching may be implemented as either persistent or not persistent. FIG. 5 is a chart illustrating a sequence of memory commands that may occur in both a persistent and a not persistent example. A sequence 505 of memory commands that may be provided by a memory controller in a persistent example includes first a NOP command indicative of data masking. As described above, the NOP command indicative of data masking may be provided responsive to a memory request that utilizes data masking. Responsive to the NOP command indicative of data masking, the memory receiving the command may configure its components for data masking functionality in accordance with signals received at a DM/DBI input. Following the NOP command, a write command may be provided that will be a masked write. Because the memory is configured for data masking, the write command may be serviced as a masked write. Moreover, because the setting is persistent, a next write command may be provided by the memory controller, and the next write command may be serviced as a masked write without requiring another interim NOP command.

A sequence 510 of memory commands that may be provided by a memory controller in a not persistent example includes a NOP command indicative of data masking. As described above, the NOP command indicative of data masking may be provided responsive to a memory request that utilizes data masking. Responsive to the NOP command indicative of data masking, the memory receiving the command may configure its components for data masking functionality. Next, a write command may be provided that may be serviced as a masked write in accordance with the functionality established responsive to the NOP command. Following that first masked write, however, the memory may restore data bus inversion functionality of the DM/DBI input. Accordingly, should another masked write be desired, the memory controller may provide another NOP command indicative of data masking, followed by another write command that may be serviced as a masked write (Masked Write 2 in the example of FIG. 5).

FIG. 5 illustrates a series of commands in examples where a default setting of the DM/DBI input may be data bus inversion functionality. In other examples, a default setting of the DM/DBI input may be data masking, and the NOP commands may be provided by the memory controller prior to memory commands utilizing data bus inversion.

In examples of the present invention, a memory may be pre-configured to perform DM/DBI dynamic switching in accordance with any of the examples described above. In some examples, however, memory may be capable of operating either using dynamic switching as described above or a static setting. Referring back to FIG. 1, the controller 150 may program the mode register 160 during start-up of a system or memory 100. The controller 150 may program the mode register 160 for static operation of the DM/DBI input 172 as either data masking or data bus inversion functionality for example. In some examples, the controller 150 may program the mode register 160 to set a default setting of the DM/DBI input 172 to either data masking or data bus inversion functionality. In some examples, the controller 150 may program that mode register 160 or a different configuration register to indicate either static operation of the DM/DBI input 172 or dynamic switching in accordance with an embodiment described above. Accordingly, a bit of the mode register 160 or of a separate configuration register may indicate whether the functionality of the DM/DBI input 172 may be dynamically switched. Accordingly, a same memory 100 may be used in systems utilizing a static setting for the DM/DBI input 172 and in systems utilizing dynamic switching. The command decoder 106 may provide signals to the control logic 170 to switch functionality of the DM/DBI input 172 responsive to a bit of the mode register 160 or another configuration register indicating dynamic switching.

From the foregoing it will be appreciated that, although specific embodiments of the invention have been described herein for purposes of illustration, various modifications may be made without deviating from the spirit and scope of the invention.

What is claimed is:

1. A memory comprising:
a plurality of memory cells;
a command decoder, the command decoder configured to receive a command indicating whether data masking or data bus inversion operations are to be performed by the memory and further configured to provide a control signal responsive to the command, wherein a bit of an address indicates data masking when data masking and data bus inversion operations are to be performed by the memory; and
control logic coupled to an input, wherein the control logic includes:
masking logic configured to implement data masking; and
data bus inversion logic configured to implement data bus inversion;
wherein the control logic is configured to switch between implementing data masking and implementing data bus inversion during operation of the memory based on the control signal.

2. The memory of claim 1, wherein the memory cells comprise DRAM memory cells.

3. The memory of claim 1, wherein the control logic is configured to switch between implementing data masking and implementing data bus inversion at least in part by selectively coupling one of the masking logic or the data bus inversion logic to the input.

4. The memory of claim 1, wherein the control logic is configured to switch between implementing data masking and implementing data bus inversion responsive to receipt by the memory of a command including a bit indicative of either masking control or data bus inversion functionality.

5. The memory of claim 4, wherein the command comprises a no operation command.

6. The memory of claim 4, further comprising a command decoder configured to receive the command and provide signals to the control logic responsive to the bit.

7. The memory of claim 1, wherein the input comprises a pin.

8. The memory of claim 1, wherein the control logic is configured to switch between the masking logic and the data bus inversion logic persistently.

9. The memory of claim 1, wherein the control logic is configured to switch back to a default setting following servicing of a memory request.

10. The memory of claim 1, further comprising a configuration register configured to store a bit indicative of dynamic switching operation or static operation, and wherein the control logic is configured to switch between implementing data masking and implementing data bus inversion during operation of the memory when the bit is set indicative of dynamic switching operation.

11. A method for dynamic switching between data bus inversion and data masking functionality, the method comprising:
receiving a command at a command decoder, wherein the command includes a bit in an address associated with the command, wherein a first value of the bit is indicative of data bus inversion functionality and a second value of the bit is indicated of data masking functionality; and
implementing data masking functionality for a next memory write when the bit is indicative of data masking functionality.

12. The method of claim 11, wherein the command comprises a no operation command.

13. The method of claim 11, wherein said implementing data masking functionality includes coupling data mask logic between an input and other memory components responsive to the bit indicative of data masking functionality.

14. The method of claim 11, further comprising:
returning an input to data bus inversion functionality after the next memory write.

15. The method of claim 14, wherein said returning an input to data bus inversion functionality includes coupling data bus inversion logic between an input and other memory components.

16. The method of claim 11, further comprising:
retaining data masking functionality until receipt of a command including a bit indicative of data bus inversion functionality.

17. A method of controlling a memory, the method comprising:
providing a command to the memory, wherein the command includes a bit in an address of the command, wherein a first value of the bit is indicative of data masking functionality and a second value of the bits is indicative of data bus inversion functionality;
providing a further command to the memory, wherein the further command utilizes the either data masking or data bus inversion functionality; and
providing a data masking/data bus inversion signal to the memory for implementation of the either data masking or data bus inversion functionality.

18. The method of claim 17, wherein the command comprises a no operation command.

19. The method of claim 17, wherein said providing a command is responsive to receipt of a memory request requiring the either data masking or data bus inversion functionality.

20. The method of claim 17, further comprising:
providing another command to the memory after the further command, wherein the another command also includes a bit indicative of either data masking or data bus inversion functionality for use with a next further command.

21. The method of claim 17, wherein the bit is indicative of data masking, and the further command comprises a write command, and wherein the method further comprising providing another write command utilizing data masking.

22. A memory controller, wherein the memory controller comprises:
an input configured to receive a memory request;
a first output configured to provide a signal for implementing data masking or data bus inversion, wherein the first output is part of an address bus;
a second output configured to provide a memory command responsive to the memory request; and
wherein the memory controller is configured to provide a command responsive to the memory request, wherein the command includes an address bit indicative of when data masking is to be performed and data bus inversion is to be performed, and wherein the memory controller is configured to provide, responsive to the memory request, the signal for implementing either data masking or data bus inversion responsive to the memory request on the first output.

23. The memory controller of claim 22, wherein the memory request includes a write request with data to be masked, and wherein said command includes a bit indicative of data masking.

24. The memory controller of claim 22, wherein the bit is in a location of the command associated with an address.

25. The memory controller of claim 22, wherein the memory controller is configured to provide a command including a bit indicative of data masking prior to each write command including data to be masked.

26. The memory controller of claim 22, wherein the memory controller is configured to provide multiple write commands with data to be masked following providing a command including a bit indicative of data masking.

* * * * *